(12) United States Patent
Kulkarni et al.

(10) Patent No.: US 10,269,419 B2
(45) Date of Patent: Apr. 23, 2019

(54) AGING AWARE DYNAMIC KEEPER APPARATUS AND ASSOCIATED METHOD

(71) Applicant: Intel Corporation, Santa Clara, CA (US)

(72) Inventors: Jaydeep P. Kulkarni, Portland, OR (US); Vivek K. De, Beaverton, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/604,519

(22) Filed: May 24, 2017

(65) Prior Publication Data

US 2018/0342289 A1 Nov. 29, 2018

(51) Int. Cl.
*G11C 7/12* (2006.01)
*G11C 11/419* (2006.01)

(52) U.S. Cl.
CPC .................. *G11C 11/419* (2013.01)

(58) Field of Classification Search
CPC .......... G11C 7/12; G11C 11/4094; G11C 7/22
USPC ............................................... 365/203, 156
See application file for complete search history.

(56) References Cited

U.S. PATENT DOCUMENTS

| 2002/0175712 A1* | 11/2002 | Kim .................... H03K 19/0963 326/98 |
| 2010/0235697 A1* | 9/2010 | Bull .................... G01R 31/3177 714/731 |
| 2011/0292748 A1* | 12/2011 | Adams ................ G06F 17/5045 365/203 |
| 2017/0270998 A1* | 9/2017 | Kulkarni ............... G11C 11/419 |

OTHER PUBLICATIONS

Cho, M. et al., "Aging-Aware Adaptive Voltage Scaling in 22 nm High-K/Metal-Gate Tri-Gate CMOS", CICC 2015, pp. 1-4 (4 pages).
Igarashi, M. et al., "An On-die Digital Aging Monitor against HCI and xBTI in 16 nm Fin-FET Bulk CMOS Technology", ESSCIRC 2015, pp. 112-115 (4 pages).
Kim, T et al., "Silicon Odometer: An On-Chip Reliability Monitor for Measuring Frequency Degradation of Digital Circuits", IEEE Journal of Solid-State Circuits, vol. 43, No. 4, Apr. 2008, pp. 874-880.

\* cited by examiner

*Primary Examiner* — Hoai V Ho
*Assistant Examiner* — Minh Dinh
(74) *Attorney, Agent, or Firm* — Green, Howard & Mughal LLP

(57) ABSTRACT

Described is an apparatus which comprises: a memory bit-cell; a local bit-line (LBL) coupled to the memory bit-cell via a read port device; a NAND gate circuitry coupled to the LBL; and a stack of keepers coupled to the LBL, wherein at least one transistor of the stack of keepers is controllable according to an output of the NAND gate circuitry, wherein the stack of keepers includes transistors with variable strength which are to be turned on overtime.

22 Claims, 13 Drawing Sheets

AGING AWARE DYNAMIC KEEPER APPARATUS AND ASSOCIATED METHOD

BACKGROUND

Register Files (RF), Read Only Memories (ROMs) and Content Addressable Memories (CAMs) usage is increasing rapidly in modern microprocessor and SoC (System-on-Chip) designs due to their energy efficient local storage/access to feed various compute blocks such as Arithmetic Logic Unit (ALU), accelerators, graphics execution units, etc. Supply voltage scaling, which is an effective knob for improving energy efficiency, is governed by the memory array $V_{MIN}$ or the data path logic $V_{MIN}$. Here, the term "$V_{MIN}$" or "minimum operating voltage" generally refers to the lowest operating voltage level below which the memory will lose its data or may not function properly. Lowering the $V_{MIN}$ for memory (when that $V_{MIN}$ is the limiter) and/or reducing memory dynamic power at ISO-$V_{MIN}$ (when the $V_{MIN}$ of the logic is the limiter) is preferred for improved energy efficiency of the entire design.

Voltage-temperature stress-induced aging of p-type and n-type transistors due to NBTI (n-type bias temperature instability)/PBTI (p-type bias temperature instability) and HCI (Hot Carrier Injection) in scaled high-k/metal-gate Complementary Metal Oxide Semiconductor (CMOS) impacts maximum frequency ($F_{MAX}$), $V_{MIN}$, and noise margin of digital logic and Static Random Access Memory (SRAM) arrays in SoC Intellectual Property (IP) blocks over the operational lifetime. Typically, the worst-case aging impacts are included in the $F_{MAX}/V_{MIN}$ settings as guardbands (or margin), and the circuits are designed for adequate noise immunity in the presence of worst-case aging degradations. Thus, significant performance and power overheads are incurred over the lifetime of the SoC.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
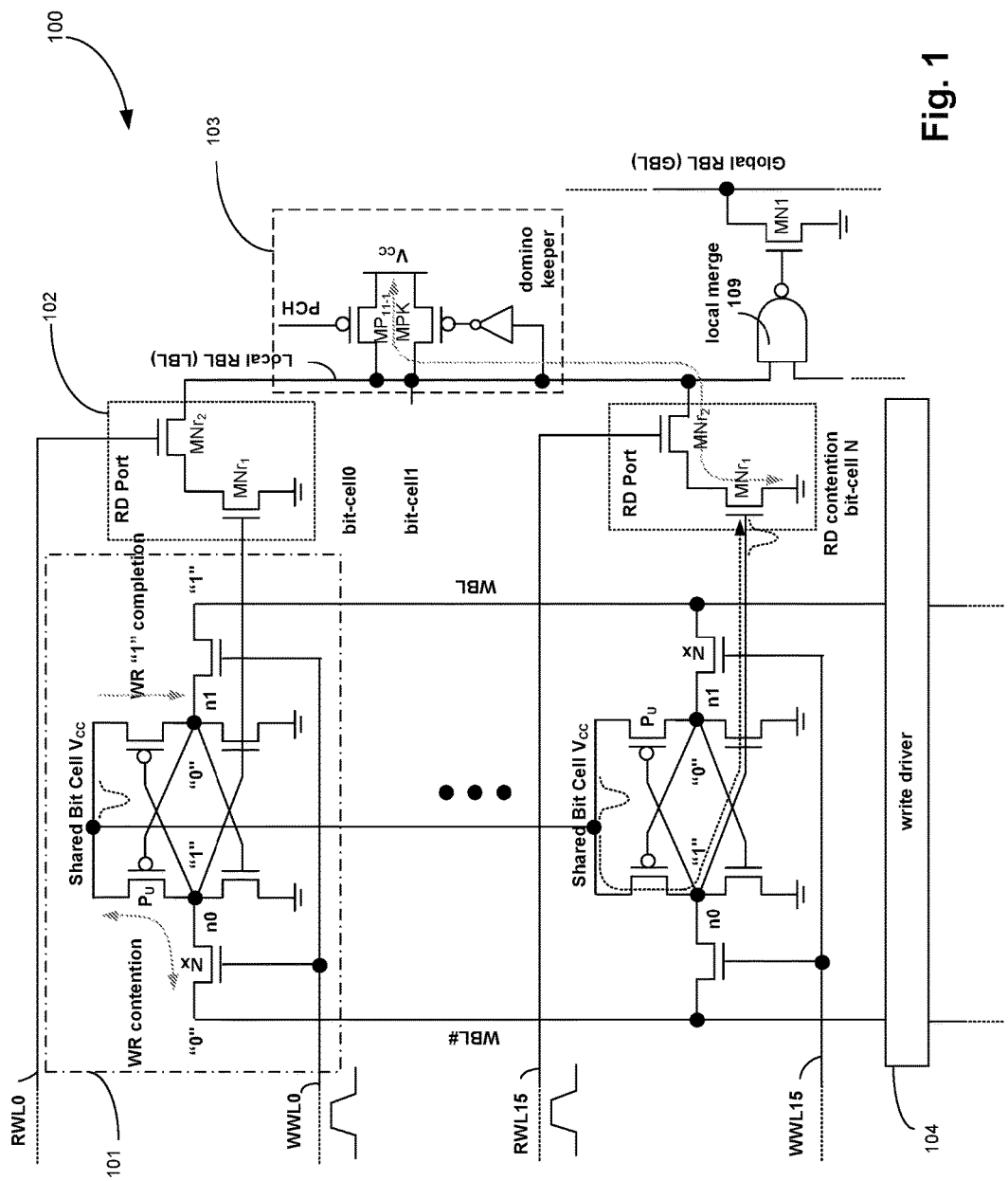
FIG. 1 illustrates a register file (RF) with an n-type read port.

Some embodiments describe an aging aware dynamic keeper topology that can improve the performance of a domino read path in large signal sensing arrays while maintaining the same noise immunity as of a baseline design over an operational lifetime. Typical design approach uses upsized keeper to meet the noise immunity at end of the life. However it degrades the performance significantly due to increased contention caused by the keeper stack. Here, the term "keeper" or "keeper stack" generally refers to a building block of a domino or dynamic logic that is used to hold a level of charge on a node according to a charge condition of the node. A keeper may include one transistor or a series coupled stack of transistors.

In some embodiments, a keeper stack is provided which is driven from a NAND gate instead of an inverter. In some embodiments, during a pre-charge phase, the NAND gate output is transitioned high which turns off the keeper stack and lowers the aging impact. In some embodiments, during an evaluate mode, the keeper stack is controlled by a local bit-line (LBL) transition. Here, reference to signals and node names are interchangeably used. For example, LBL may refer to LBL node or signal on LBL node.

In some embodiments, an on-die aging monitor (also referred to as a lifetime monitor or circuitry) is provided to track aging impacts on the performance of static CMOS logic critical paths (e.g., a keeper circuitry associated with a memory). In some embodiments, the on-die aging monitor avoids the performance impact at the beginning of the product life due to upfront upsizing of the keeper stack. In some embodiments, additional keeper devices are progressively activated based on the design lifetime. This progressive upsizing of the keeper stack, as opposed to upfront upsizing of the keeper stack, improve the effective keeper stack and maintains the same noise immunity over the lifetime of the product. Other technical effects will be evident from the various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a register file (RF) with an n-type read port. FIG. 1 shows a baseline one read and one write (1R/1W) RF design with hierarchical local and global read BLs. RF 100 includes memory cells (e.g., 101) with read ports (e.g., 102), domino keeper 103, write driver 104, local read bit-line (LBL), local merge logic 109, global read bit-line (GBL), read word-lines (RWLs), write word-lines (WWLs), and write bit-lines (WBLs).

Here, sixteen 8-T (eight transistor) Static Random Access Memory (SRAM) bit cells are shown (e.g., bit-cell 0, bit-cell 1 . . . bit-cell N, where 'N' is an integer) organized in a column. For example, 'N' can be 7, 15, or 31 or higher number of bits. Each bit-cell receives its own RWL and WWL, and shares WBL and its inverse (i.e., WBL#) with other bit-cells in the same column. While various embodiments here are described with reference to an 8-T SRAM architecture, the embodiments are also applicable to other types of memories such as 4-T, 6-T, SRAMs, Read Only Memories (ROMs), Content Addressable Memories (CAMs), and any circuit having a dynamic keeper in the read path.

Continuing with the example of the 8-T bit-cell, each bit-cell includes a 6-T memory cell 101 and a 2-T read port 102. The 6-T memory cell 101 includes cross-coupled inverters powered by a shared bit-cell $V_{CC}$ (power supply). The cross-coupled inverters include two p-type transistors and two n-type transistors as shown such that node n0 is input to one inverter and output to the other inverter, and node n1 is input to one inverter and output to the other inverter. The 6-T memory cell includes access devices coupled to nodes n0 and n1, and coupled to WBL and WBL#, respectively. The gate terminals of the access devices (here, n-type devices) are controlled by the WWL. For example, for bit-cell 0, the access devices are controlled by WWL0, for bit-cell 1, the access devices are controlled by WWL1, and so on such that the access devices for bit-cell 15 are controlled by WWL15.

The read port (RD Port) 102 includes two n-type devices $MN_{r1}$ and $MN_{r2}$. Here, n-type transistor $MN_{r1}$ is coupled in series with n-type transistor $MN_{r2}$. The gate terminal of the n-type transistor $MN_{r2}$ is controlled by RWL0, while the gate terminal of the n-type transistor $MN_{r1}$ is coupled to a data node (e.g., one of nodes n0 or n1). The output of RD Port 102 is LBL. The charge on LBL is held by domino keeper 103. Each LBL may have its own domino keeper. Domino keeper 103 includes a pre-charge p-type transistor $MP_{11-1}$ which is controlled by a pre-charge signal (PCH). Domino keeper 103 includes a keeper device (or domino keeper) MPK controlled by an inverter having an input coupled to LBL and an output coupled to the gate terminal of p-type transistor MPK. While FIG. 1 shows one keeper device MPK, in some embodiments, to reduce contention and assist timing there can be one or more p-type transistors such that the gate terminals of the one or more p-type transistors is controlled by an inverter while the other gate terminals of the p-type keeper are tied to Vss (ground)

The read port of the multiple bit-cells (e.g., 16, 32, or 64) are evaluated using local read merge NAND gate 109. The outputs of merge NAND gate 109 drive the global BL pull-down devices (e.g., n-type transistor MN1). The global BLs (GBLs) are evaluated using a Set Dominant Latch (SDL) or a regular latch.

In some examples, a tristate write BL driver 104 is provided which is shared by multiple entries/bundles of memory cells. In some embodiments, the tristate write BL driver allows additional power savings by avoiding WBL toggling in unselected bundles of memory cells and also by lowering the driver leakage due to a stacking effect. The various embodiments are not limited to tristate write BL drivers. In some embodiments, inverter based (non-tristate) write drivers may be used.

Figure 2:
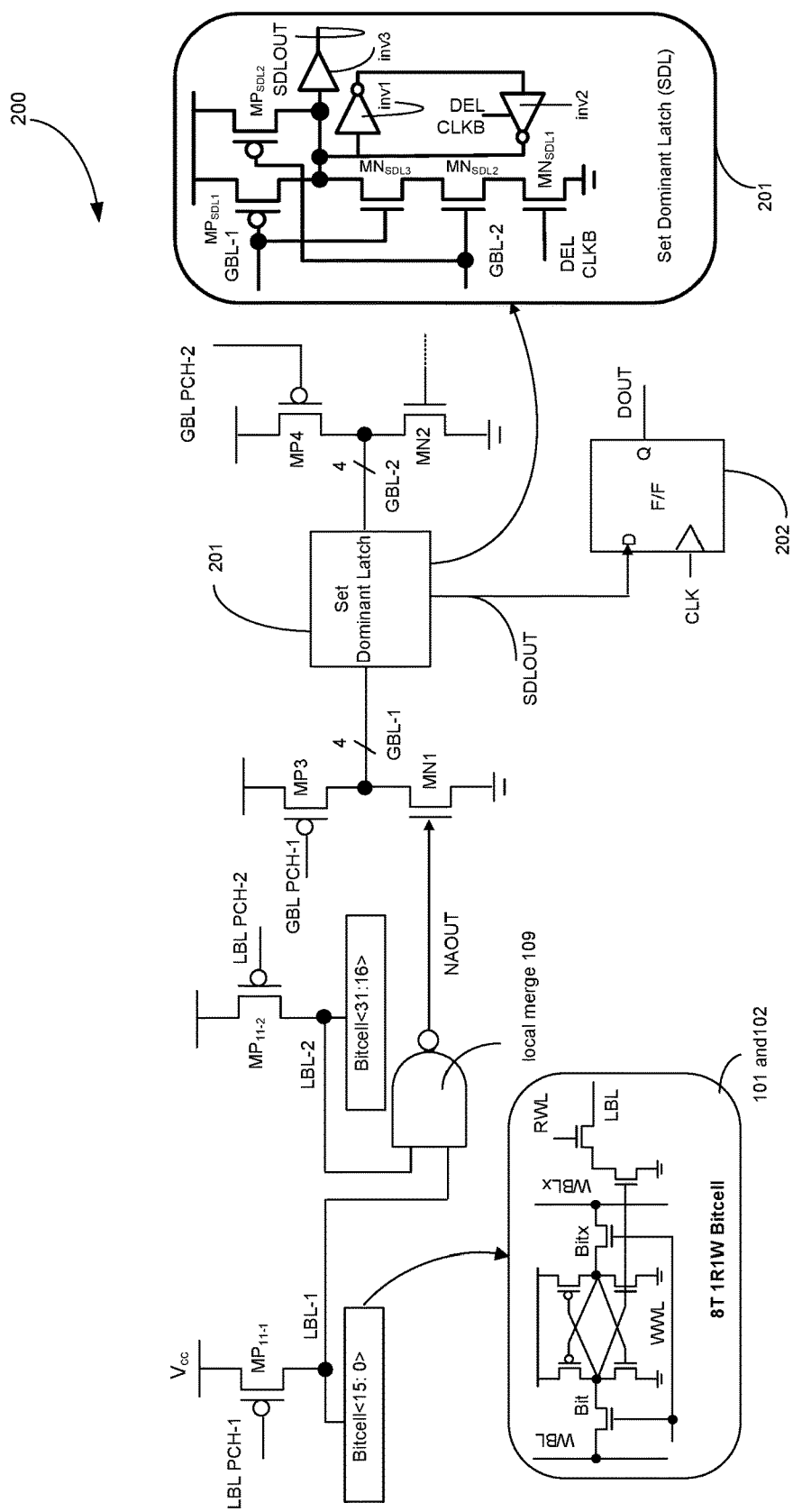
FIG. 2 illustrates the read path of the RF of FIG. 1.

FIG. 2 illustrates the read path of the RF of FIG. 1. It is pointed out that those elements of FIG. 2 having the same reference numbers (or names) as the elements of any other figure can operate or function in any manner similar to that described, but are not limited to such.

In some embodiments, read path includes SDL 201 and Sampler 202. Read path 200 includes a portion of RF 100 and more details of logic that come after local merge NAND gate 109. LBLs for each column of bit-cells is received by local merge NAND gate 109. For example, LBL-1 associated with the first set of sixteen bit-cells (e.g., Bitcell<15:0>), and LBL-2 associated with the second set of sixteen bit-cells (e.g., Bitcell<31:16>) are received by local merge NAND gate 109 that provides an output NAOUT. As described with reference to FIG. 1, any number or group of bit-cells may be used. For example, 8, 16, or 32 bit-cells per LBL can be used. Each LBL has a pre-charge controlled device. Here, p-type pre-charge device $MP_{11-1}$ is coupled to LBL-1 and controlled by LBL PCH-1, and p-type pre-charge device $MP_{11-2}$ is coupled to LBL-2 and controlled by LBL PCH-2.

The output NAOUT controls the pull-down device MN1 which pull-downs GBL-1 (which may be a multi-bit bus (e.g., 4 bits)). For example, GBL-1 may refer to node GBL-1 or signal GBL-1 depending on the context of the sentence. In some embodiments, a p-type device MP3 is coupled in series with the pull-down transistor MN1, where transistor MP3 is controlled by a first pre-charge GBL signal GBL PCH-1. SDL 201 latches signals on GBLs that provides an output SDL OUT. Here, signal names and nodes names are interchangeably used. For example, a second GBL-2 from another bank of memory cells is also received by SDL 201.

Here, GBL-2 is provided by the series output transistors MP4 and MN2, where the p-type transistor MP4 is controlled by second pre-charge GBL signal GBL PCH-2. One embodiment of SDL 201 is illustrated in FIG. 2. SDL 201 comprises transistors $MN_{SDL1}$, $MN_{SDL2}$, $MN_{SDL3}$, $MP_{SDL1}$, and $MP_{SDL2}$, inverter inv1, clock enabled inverter inv2 (enabled by delayed clock DEL CLKB, which is an inverse of CLK), and buffer inv3 coupled together as shown. The gates of transistors $MP_{SDL1}$ and $MN_{SDL3}$ are controlled by GBL-1. The gates of transistors $MN_{SDL2}$ and $MP_{SDL2}$ are controlled by GBL-2. The gate of transistor $MN_{SDL1}$ is controlled by DEL CLKB. The output of SDL 201 is SDLOUT which is then sampled by flip-flop 202 to provide output data DOUT.

Figure 3A:
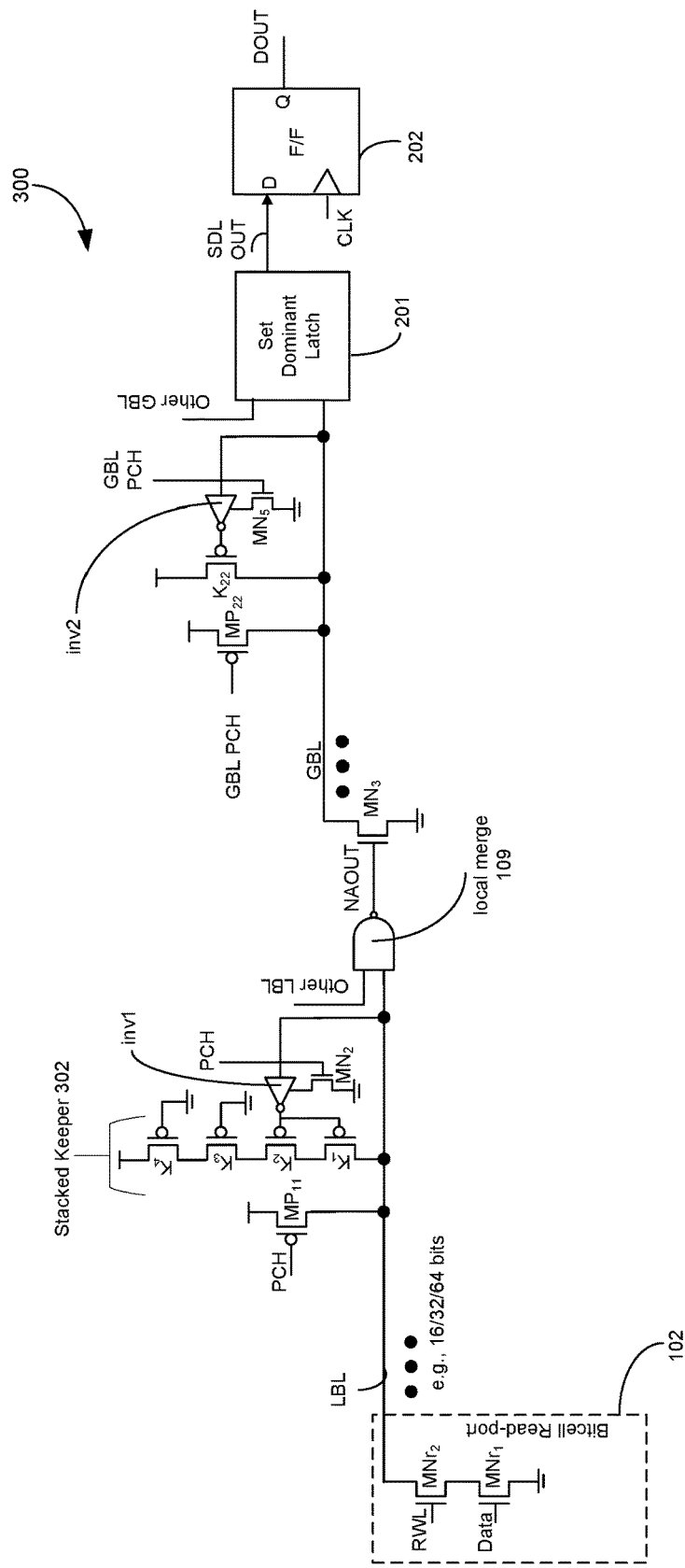
FIG. 3A illustrates an apparatus showing a domino-read BL sensing scheme.

FIG. 3A illustrates an apparatus showing a domino-read BL sensing scheme. It is pointed out that those elements of FIG. 3 having the same reference numbers (or names) as the elements of any other figure can operate or function in any manner similar to that described, but are not limited to such.

In some embodiments, keeper transistor MPK is a stack of transistors (referred to as Stacked Keeper 302) coupled to LBL. In some embodiments, the stack of transistors include comprises p-type transistors $K_1$, $K_2$, $K_3$, and $K_4$ coupled together in series. While Stacked Keeper 302 is described having four stacked p-type transistors, fewer or more p-type transistors may be used for forming Stacked Keeper 302. In some embodiments, the gate terminals of p-type transistors $K_3$ and $K_4$ are coupled to ground (i.e., configured to be turned on). In some embodiments, the gate terminals of p-type transistors $K_1$ and $K_2$ are controlled by an output of an inverter inv1 (different from inv1 of FIG. 2) which inverts the signal on the LBL node. In some embodiments, at least one transistor (e.g., $K_1$) in the stack of transistors is controlled by the output of the inverter inv1. As such, when the voltage on the LBL is higher than the switching threshold of the inverter inv1, the voltage on node LBL is pulled to Vcc by Stacked Keeper 302.

In some embodiments, the inverter inv1 coupled to the p-type transistor $K_2$ is enabled by the pre-charge signal (PCH) via n-type transistor $MN_2$. In some embodiments, apparatus 300 comprises p-type transistor $MP_{11}$ which is controlled by PCH. In some embodiments, when PCH is low, LBL is pulled to Vcc by the p-type transistor $MP_{11}$ while Stacked Keeper 302 is disabled by transistor $MN_2$.

As discussed with reference to FIG. 2, the output of the local merge NAND gate 109 is NAOUT which is received by pull-down n-type transistor $MN_3$. The transistor $MN_3$ is coupled to the GBL. In some embodiments, GBL is pre-charged by p-type transistor $MP_{22}$ which is controlled by the GBL PCH. In some embodiments, a keeper is provided to preserve the charge on GBL according to the voltage level of GBL.

In some embodiments, the keeper is like Stacked Keeper 302 but for keeping the charge of GBL. In some embodiments, the keeper comprises a p-type device $K_{22}$ which is controlled by inverter inv2 that receives GBL as input. As such, when the voltage on the GBL is higher than the switching threshold of the inverter inv2, the voltage on node GBL is pulled to Vcc by the keeper device $K_{22}$. In some embodiments, the inverter inv2 coupled to the p-type transistor $K_{22}$ is enabled by GBL PCH via an n-type transistor $MN_5$. As discussed with reference to FIG. 2, the GLB is received as input by SDL 201.

However, the domino keeper of architecture of FIG. 1 and FIG. 3A results in aging issues that will reduce performance of the circuit. These aging issues are described here with reference to idle and active mode stress conditions for domino-read path. In idle mode, where the domino read path is in pre-charge (PCH) state or mode, LBL pre-charge p-type transistor $MP_{11}$ and keepers $K_{1-4}$, LBL merge NAND pull-down n-type transistor (e.g., transistor in local merge 109), GBL pre-charge p-type transistor $MP_{22}$, feedback inverter pull-down n-type transistor (e.g., n-type transistor of inverter inv1), and set dominant latch (SDL) pull-down n-type transistors $MN_{SDL3}$ and $MN_{SDL2}$ are stressed. Other transistors that are stressed include pull-up transistor $P_u$ of bit-cell 101 whose gate is at logic high, and n-type pull-down transistor whose gate is at logic low.

During active read operation, RWL n-type transistor $MN_{r2}$, LBL merge NAND p-type transistor (e.g., transistor in local merge 109), GBL merge NAND pull-down n-type transistor MN1 of FIG. 2, feedback inverter pull-up p-type transistor (e.g., pull-up transistor of inverter inv2), and SDL pull-up p-type transistor $MP_{SDL2}$ are stressed. For worst-case aging impact on read $F_{MAX}$, the read port bit n-type transistor $MN_{r1}$ is stressed with a stored bit-cell value of '1', while for the worst-case read noise margin impact, read port bit n-type transistor $MN_{r1}$ is stressed with a stored value of '0'.

Figures 3B, 3C:
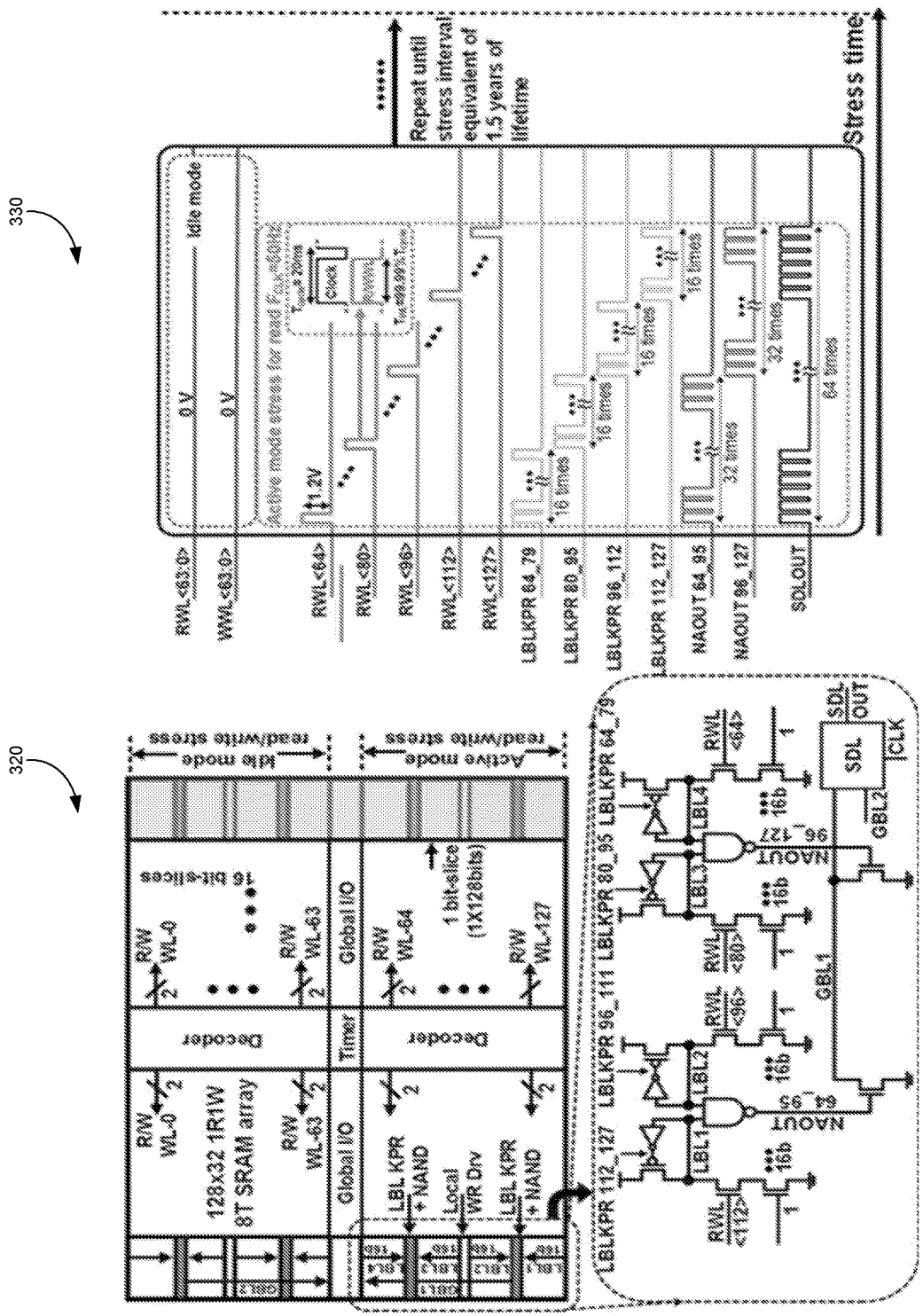
FIG. 3B illustrates an 8T SRAM array floorplan where a lower half of the array experiences idle mode stress while an upper half of the array experiences active mode stress.
FIG. 3C illustrates waveforms showing an aging stress measurement methodology.

FIG. 3B illustrates an 8T SRAM array (e.g., 4 Kb) floorplan 320 where a lower half of the array (e.g., WL [63:0]) experiences idle mode stress while an upper half of the array (e.g., WL [127:64]) experiences active mode stress. FIG. 3C illustrates waveforms 330 showing aging stress measurement methodology.

In this example, the chip is stressed at 1.2V/90° C. for a duration equivalent to 1.5 years of lifetime. Read $F_{MAX}$/$V_{MIN}$ measurements are performed at nominal voltages after each stress interval. This stress and measurement sequence is repeated six times to capture the progressive impacts of aging for a cumulative stress duration equivalent to 10.5 years of lifetime. The lower half of the array is characterized for idle mode stress, with R/WWL[63:0] held at '0' during the entire stress interval. The upper half of the array is characterized for active mode read/write stress where R/WWL[64:127] are stressed sequentially, and this cycle is repeated for the entire stress interval. A 50 Hz stress cycling frequency with 99.99% R/WWL pulse width is used for maximum stressing of the active wordline transistors. The stress duration is progressively higher along the domino read path. The p-type transistors driving the keepers in the LBL keeper nodes, shared among the 16 bit-cells on each LBL, are subjected to 16 times longer stress than the RWL n-type transistor. Similarly, transistors at the LBL merge NAND output nodes are stressed 32 times longer. Devices at the SDL output node (SDLOUT) experience 64 times higher duration of stress.

Figures 3D, 3E, 3F:
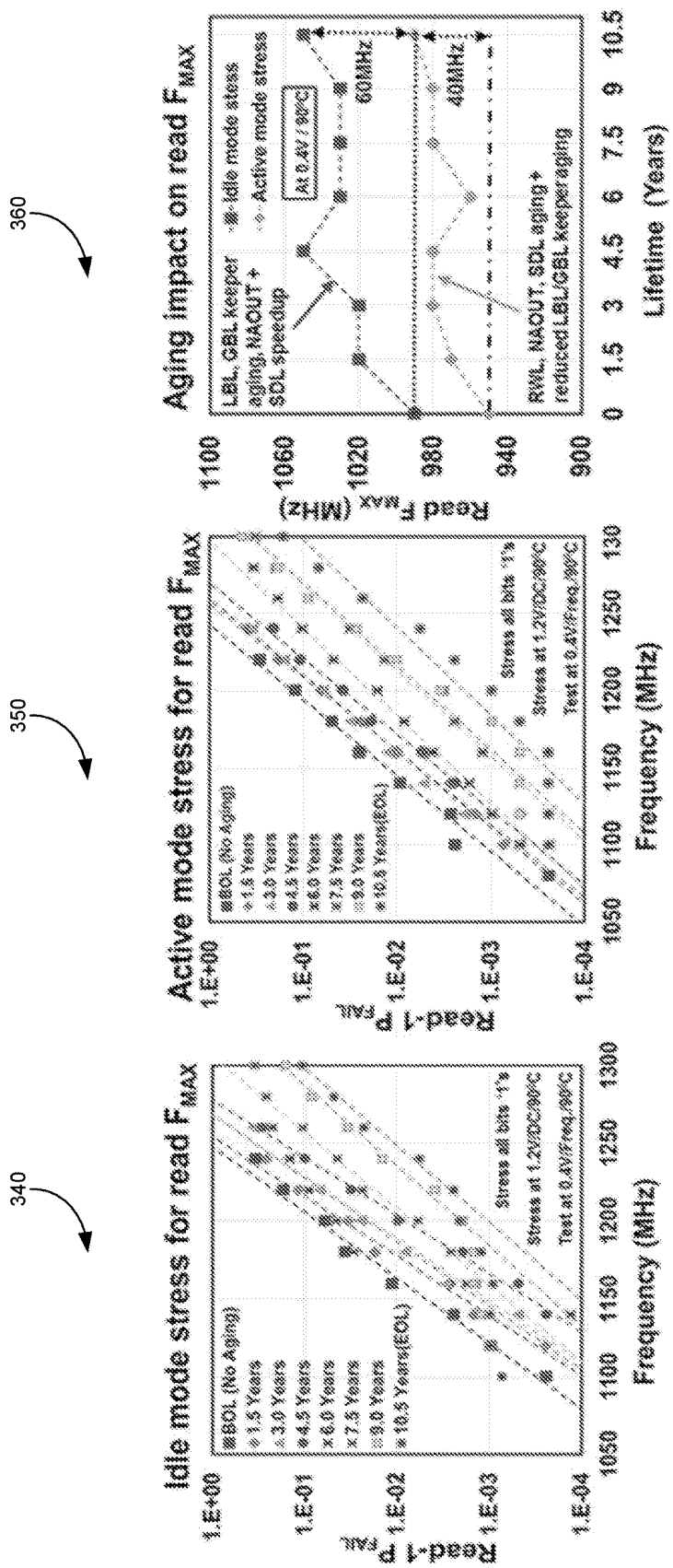
FIGS. 3D-F illustrate plots showing array level read distribution for idle/active mode stress.

FIGS. 3D-F illustrate plots 340, 350, and 360 showing array level read distribution for idle mode stress, active mode stress, and aging impact on read $F_{MAX}$, respectively. Here, domino-read $F_{MAX}$ increases with keeper aging unlike the static logic path $F_{MAX}$ degradation. Plots 340, 350, and 360 together illustrate the impact of aging on the domino read path performance under idle and active stress modes. Read-1 measurements are performed at different lifetime intervals. In this example, read $F_{MAX}$ for target 1 Mb array improves by 60 MHz for idle mode and by 40 MHz in the active mode.

Figures 3G, 3H, 3I:
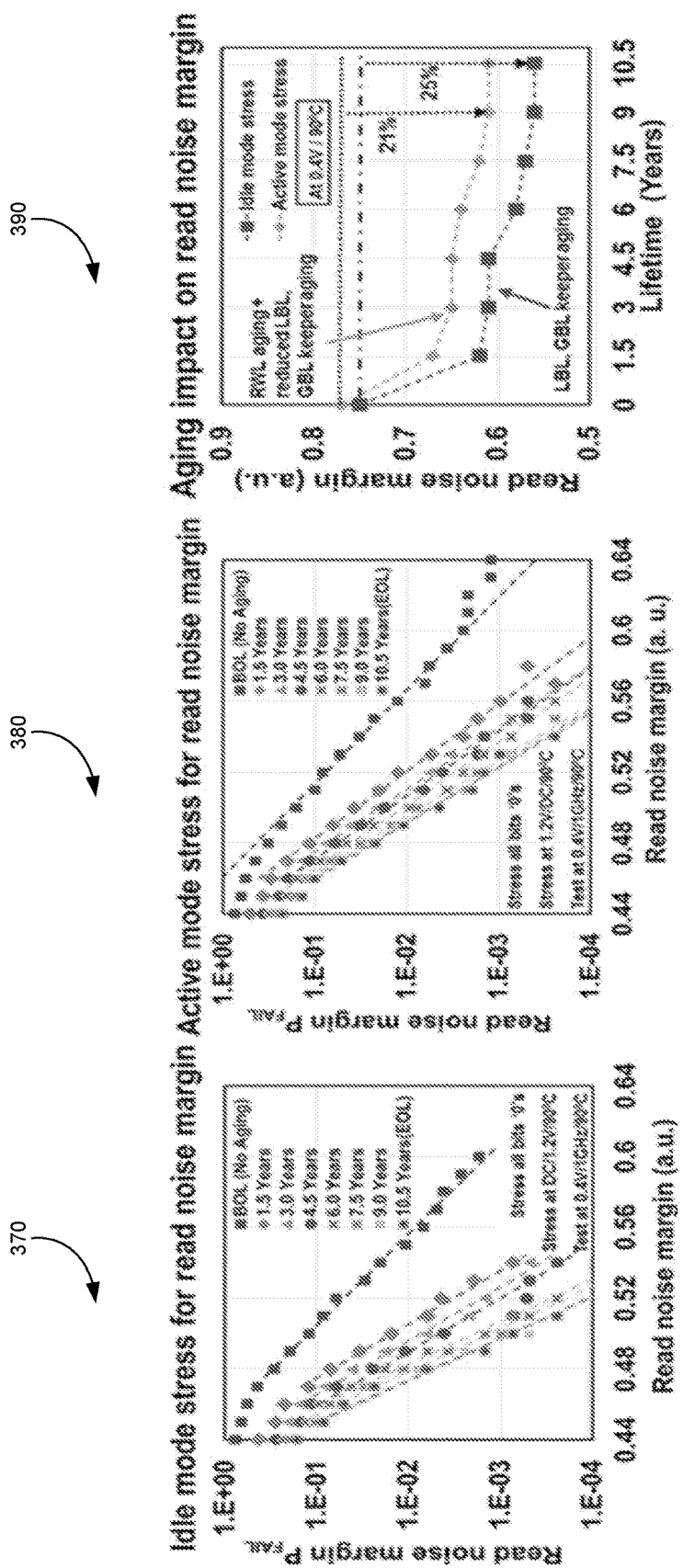
FIGS. 3G-I illustrate plots showing array level read noise margin $P_{FAIL}$ distribution for idle/active mode stress.

FIGS. 3G-I illustrate plots 370, 380, and 390 showing array level read noise margin $P_{FAIL}$ distribution for idle mode stress, active mode stress, and aging impact on read noise margin, respectively. Here, read noise margin degrades with keeper aging. During active mode, less degradation in noise margin is seen due to weaker read port access transistor (RWL). Plots 370, 380, and 290 together show the impact of aging on the domino read path noise immunity under idle and active stress modes. With aging, the noise-margin degrades by 25% during idle mode and by 21% during active mode. Hence an aging-aware dynamic keeper upsizing from BOL (beginning of life) to EOL (end of life) can achieve higher read $F_{MAX}$ over the operational lifetime while maintaining adequate noise margin, in accordance with some embodiments.

Figure 4:
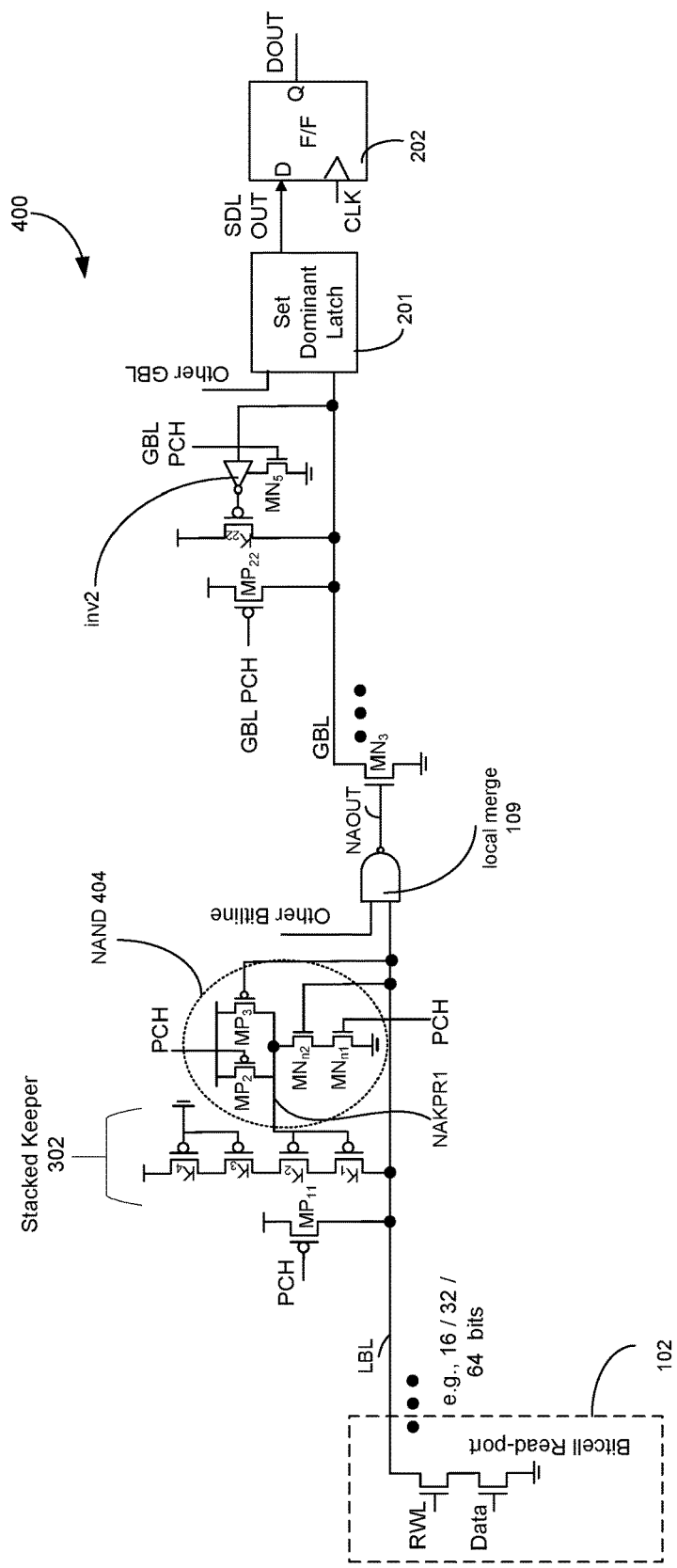
FIG. 4 illustrates an apparatus showing local bit line (LBL) sensing scheme with NAND controlled keeper stack for reduced keeper aging, according to some embodiments of the disclosure.

FIG. 4 illustrates apparatus 400 showing local bit line (LBL) sensing scheme with NAND controlled keeper stack for reduced keeper aging, according to some embodiments of the disclosure. It is pointed out that those elements of FIG. 4 having the same reference numbers (or names) as the elements of any other figure can operate or function in any manner similar to that described, but are not limited to such.

In some embodiments, inverter inv1 is replaced with a NAND 404 which comprises n-type transistors $MN_{n1}$ and $MN_{n2}$, and p-type transistors $MP_2$ and $MP_3$ coupled together as shown. In some embodiments, the gate terminals of transistor $MN_{n2}$ and transistor $MP_3$ are controlled by LBL. In some embodiments, the gate terminals of transistor $MP_2$ and transistor $MN_{n1}$ are controlled by PCH. In some embodiments, the output NAKPR1 of NAND gate 404 controls at least one transistor of Sacked Keeper 302. In this example, the output NAKPR1 of NAND gate 404 controls the gate terminal of $K_1$ and $K_2$. In another example, the output NAKPR1 of NAND gate 404 controls the gate terminals of $K_1$.

Apparatus 400 shows a reduced keeper aging topology in which at least one transistor of Stacked Keeper 302 is driven from NAND 404 instead of inverter inv1. During the pre-charge phase (e.g., PCH=0), NAKPR1 is transitioned high. This turns off the keeper stack 302 and lowers the keeper stack aging impact. During the evaluate mode (e.g., PCH=1), Stacked Keeper 302 is controlled by the LBL transition.

Figure 5:
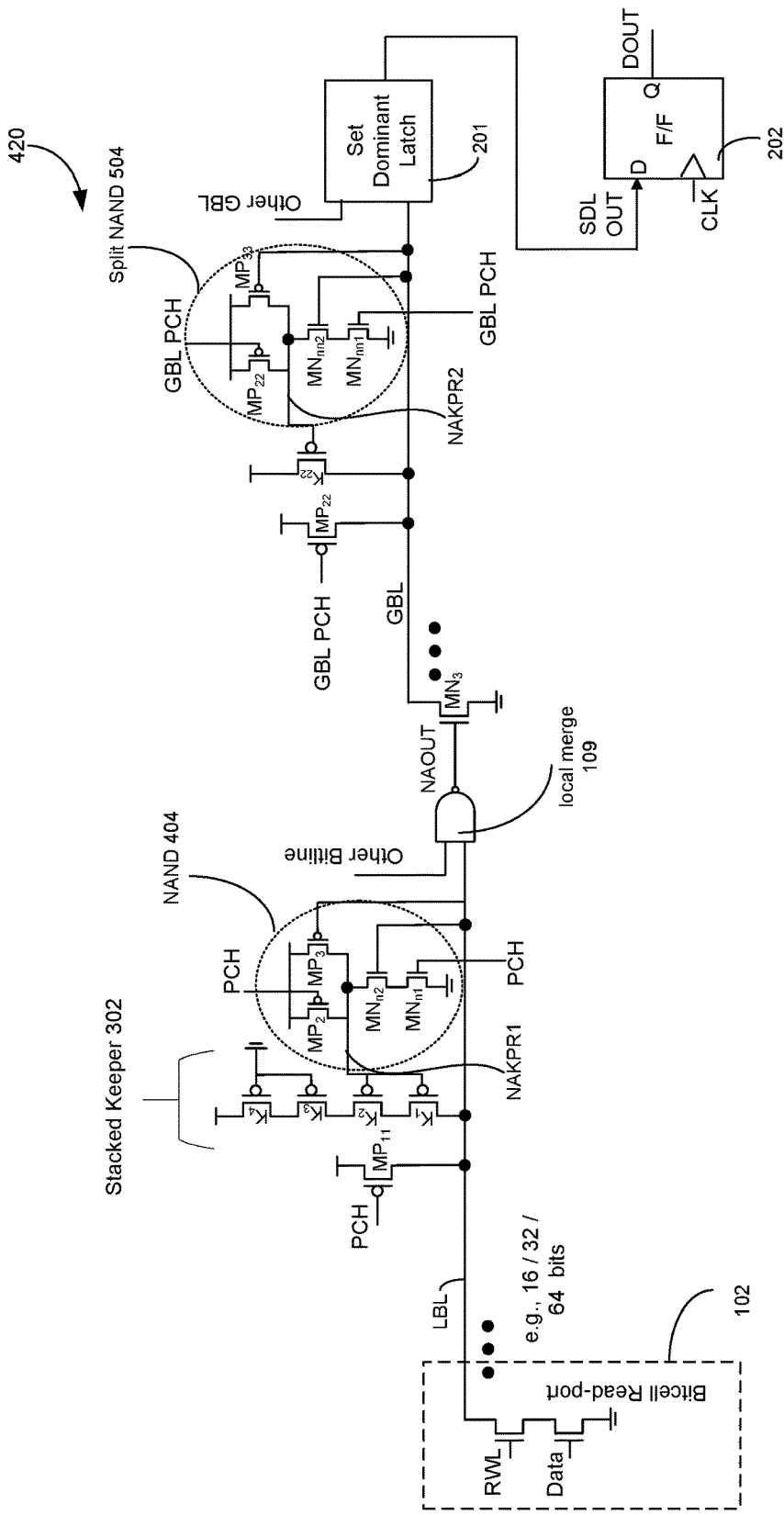
FIG. 5 illustrates an apparatus showing LBL and global bit-line (GBL) sensing scheme with NAND controlled keeper stack for reduced keeper aging, according to some embodiments of the disclosure.

FIG. 5 illustrates apparatus 500 showing LBL and global bit-line (GBL) sensing scheme with NAND controlled keeper stack for reduced keeper aging, according to some embodiments of the disclosure. It is pointed out that those elements of FIG. 5 having the same reference numbers (or names) as the elements of any other figure can operate or function in any manner similar to that described, but are not limited to such.

Apparatus 500 is similar to FIG. 4, except that inverter inv2 is replaced with NAND 504. In some embodiments, NAND 504 comprises n-type transistors $MN_{nn1}$ and $MN_{nn2}$, and p-type transistors $MP_{22}$ and $MP_{33}$ coupled together as shown. In some embodiments, gate terminals of transistor $MN_{nn2}$ and transistor $MP_{33}$ are controlled by GBL. In some embodiments, gate terminals of transistor $MP_{nn1}$ and transistor $MP_{22}$ is controlled by GBL PCH. In some embodiments, the output NAKPR2 of NAND gate 504 controls at least one transistor keeper device (e.g., transistor $K_{22}$). In this example, the output NAKPR2 of NAND gate 504 controls the gate terminal of $K_{22}$. In another example, the output NAKPR2 of NAND gate 504 controls the gate terminals of more transistors of the keeper devices (e.g., when the keeper device has stacked transistors like Stacked Keeper 302).

Apparatus 500 shows a reduced keeper aging topology in which at least one transistor of the keeper is driven from NAND 504 instead of inverter inv2. During the global pre-charge phase (e.g., GBL PCH=0), NAKPR2 is transitioned high. This turns off keeper $K_{22}$ and lowers the aging impact. During the evaluate mode (e.g., GBL PCH=1), keeper $K_{22}$ is controlled by the GBL LBL transition. While the embodiment of FIG. 5 illustrates aging aware domino keeper for LBL and GBL, in some embodiments the aging aware domino keeper scheme is provided for GBL and not for LBL.

Figure 6:
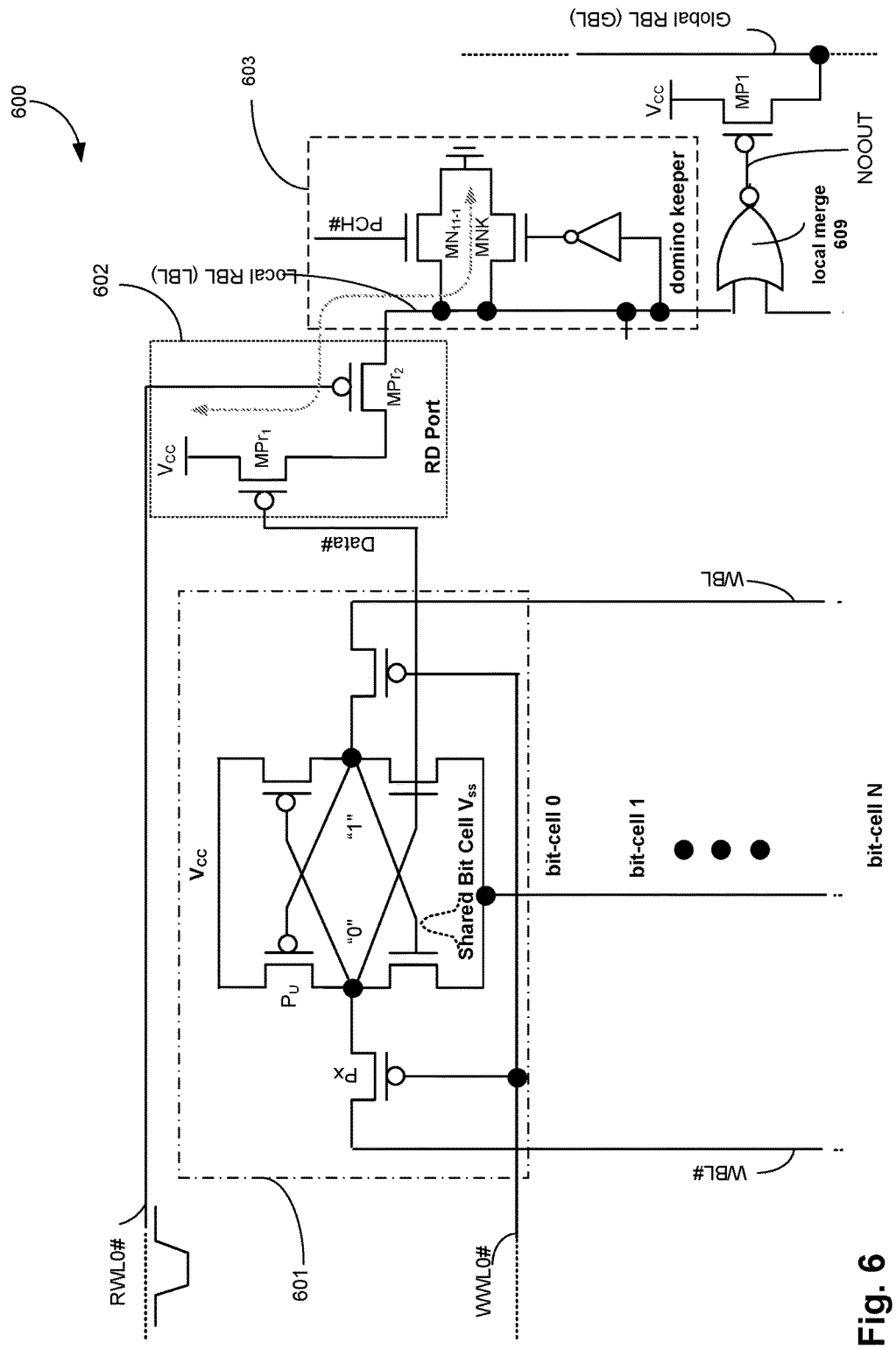
FIG. 6 illustrates a RF with full swing BL operation with a p-type read port.

FIG. 6 illustrates a RF (register file) with full swing BL operation with a p-type read port. FIG. 6 shows baseline one read and one write (1R/1W) register file design with hierarchical local and global read BLs utilizing single-ended large signal read sensing mechanism. RF 600 includes memory cells (e.g., 601) with read ports (e.g., 602), domino keeper 603, local read bit-line (LBL), local merge logic 609, GBL, read word-lines (RWL#s), write word-lines (WWLs), and write bit-lines (WBLs).

Here, 8-T (eight transistor) SRAM bit cells are shown (e.g., bit-cell 0, bit-cell 1 . . . bit-cell 15) organized in a column. Each bit-cell receives its own read word-line (RWL#) and write word-line (WWL), and shares write BL (WBL) and its inverse (WBL#) with other bit-cells in the same column. While various embodiments here are described with reference to an 8-T SRAM architecture, the embodiments are also applicable to other types of memories such as 4-T, 6-T, SRAMs, ROMs and CAMs.

Continuing with the example of the 8-T bit-cell, each bit-cell includes a 6-T memory cell 601 and a 2-T read port 602. The 6-T memory cell 601 includes cross-coupled inverters powered by a shared bit-cell Vcc (power supply). The cross-coupled inverters include two p-type transistors and two n-type transistors as shown such that node n0 is input to one inverter and output to the other inverter, and node n1 is input to one inverter and output to the other inverter. The 6-T memory cell includes p-type access devices coupled to nodes n0 and n1, and coupled to WBL and WBL#, respectively. The gate terminals of the access devices (here, p-type devices) are controlled by WWL. For example, for bit-cell 0, the access devices are controlled by WWL0, for bit-cell 1, the access devices are controlled by WWL1, and so on such that the access devices for bit-cell 15 are controlled by WWL15.

The read port (RD Port) 602 includes two p-type devices $MP_{r1}$ and $MP_{r2}$. Here, p-type transistor $MP_{r1}$ is coupled in series with transistor $MP_{r2}$. The gate terminal of the p-type transistor $MP_{r2}$ is controlled by RWL#0, while the gate terminal of transistor $MP_{r1}$ is coupled to a data node (e.g., one of nodes n0 or n1). The output of RD Port 602 is LBL. The charge on LBL is held by domino keeper 603. Each LBL may have its own domino keeper. Domino keeper 603 includes a pre-charge n-type transistor $MN_{11-1}$ which is controlled by an inverse pre-charge signal (PCH#). Domino keeper 603 includes a keeper device MNK controlled by an inverter having an input coupled to LBL and an output coupled to the gate terminal of the n-type transistor MNK.

The read port of the multiple bit-cells (e.g., 16, 32, or 64) are evaluated using local read merge NOR gate 609. The outputs of merge NOR gate 609 drive the global BL pull-up devices (e.g., p-type transistor $MP_1$). The global BLs (GBLs) are evaluated using a SDL or regular latch. A tristate write BL driver (not shown here) is shared by multiple entries/bundles of memory cells. The tristate write BL driver allows additional power savings by avoiding WBL toggling in unselected bundles of memory cells and also by lowering the driver leakage due to a stacking effect.

Figure 7:
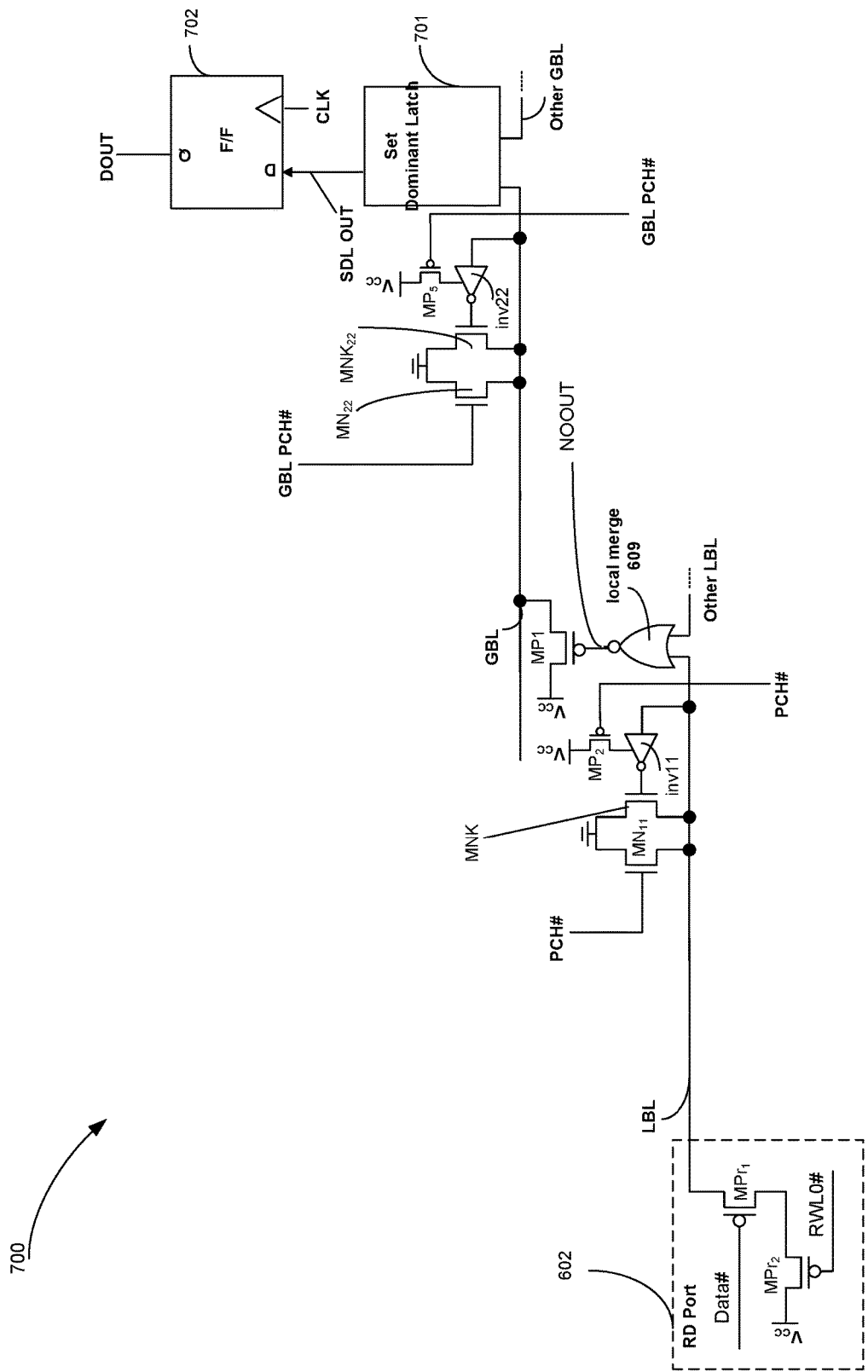
FIG. 7 illustrates an apparatus showing a domino-read BL sensing scheme associated with FIG. 6.

FIG. 7 illustrates apparatus 700 showing a domino-read BL sensing scheme associated with FIG. 6. It is pointed out that those elements of FIG. 7 having the same reference numbers (or names) as the elements of any other figure can operate or function in any manner similar to that described, but are not limited to such.

Apparatus 700 is a base-line design which comprises a stacked keeper (not shown) which is coupled to LBL node performing the same function as Stacked Keeper 302. In some embodiments, the gate terminal of n-type transistor MNK is controlled by an output of an inverter which inverts the signal on the Internal_LBL node. As such, when the voltage on the Internal_LBL is lower than the switching threshold of the inverter inv11, the voltage on node LBL2 is pulled down to ground transistor MNK.

In some embodiments, the inverter coupled to the n-type transistor MNK is enabled by PCH# (which is an inverse of PCH) via the p-type transistor $MP_2$. Apparatus 700 comprises n-type transistor $MN_{11}$ which is controlled by PCH#. In some embodiments, when PCH# is high, LBL2 is pulled to ground by the n-type transistor $MN_{11}$ while the keeper transistor MNK is disabled by transistor $MP_2$.

As discussed with reference to FIG. 6, the output of the local merge NOR 609 is NOOUT which is received by the pull-up p-type transistor MP1. The transistor MP1 is coupled to the GBL. In some embodiments, GBL is pre-discharged by n-type transistor $MN_{22}$ which is controlled by GBL PCH#. In some embodiments, a keeper is provided to preserve the charge on GBL according to the voltage level of GBL.

In some embodiments, the keeper comprises an n-type device $MNK_{22}$ which is controlled by an inverter that receives GBL as input. As such, when the voltage on the GBL is lower than the switching threshold of the inverter inv22, the voltage on node GBL is pulled to Vss (ground) by the keeper device $MNK_{22}$. The inverter coupled to the n-type transistor $MNK_{22}$ is enabled by the GBL PCH# signal via n-type transistor $MP_5$. GLB is received as input by SDL 701. In some embodiments SDL 701 is implemented to be functionally similar to SDL 201. The output SDL OUT of SDL 701 is then sampled by an edge of a clock signal CK input to a flip-flop 702 which provides output DOUT.

Figure 8:
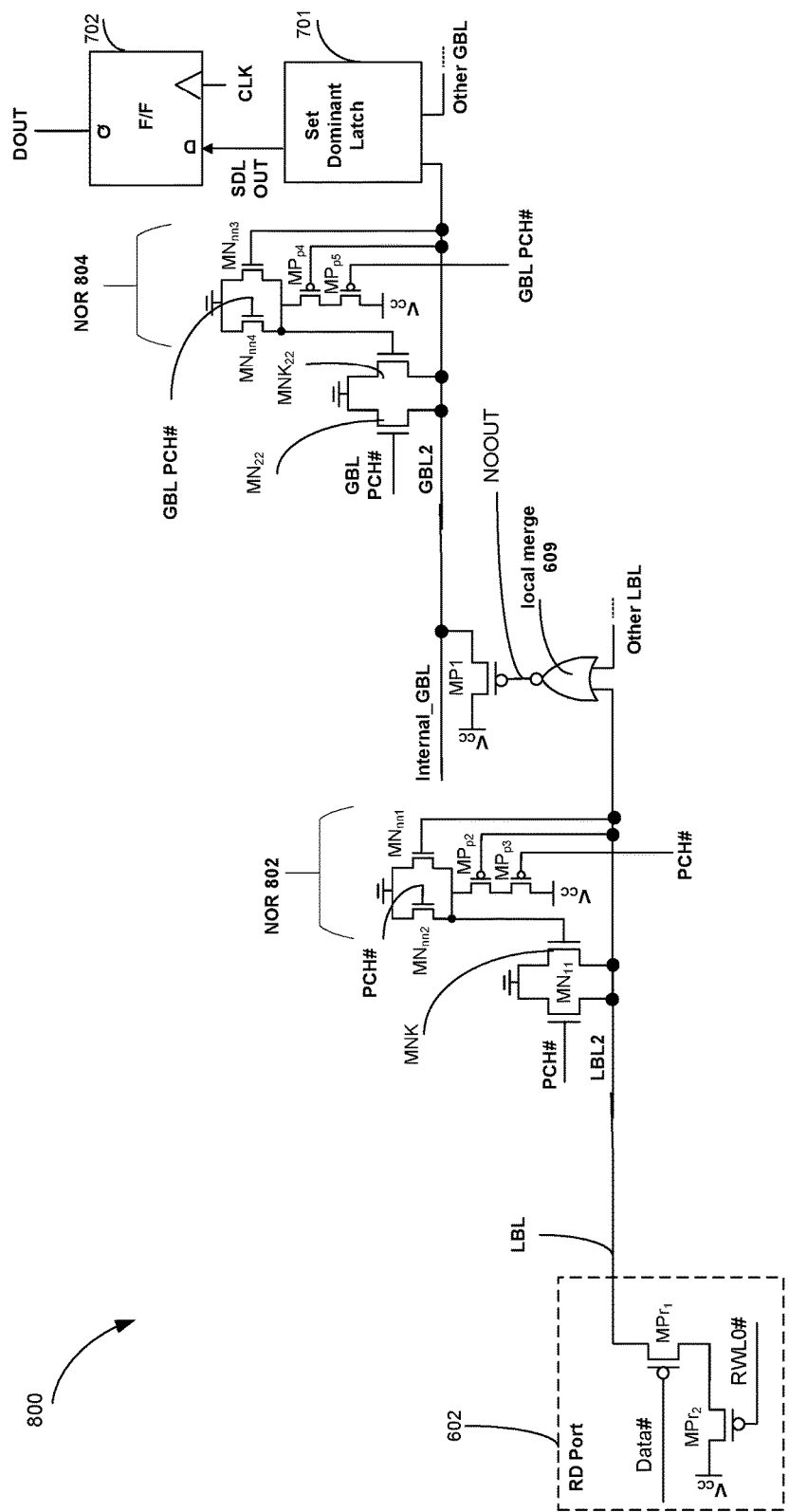
FIG. 8 illustrates apparatus showing LBL and GBL sensing scheme with p-type read port with NOR controlled keeper stack for reduced keeper aging, according to some embodiments of the disclosure.

FIG. 8 illustrates apparatus showing LBL and GBL sensing scheme with p-type read port with NOR controlled keeper stack for reduced keeper aging, according to some embodiments of the disclosure. It is pointed out that those elements of FIG. 8 having the same reference numbers (or names) as the elements of any other figure can operate or function in any manner similar to that described, but are not limited to such.

In some embodiments, a NOR gate 802 is introduced to control keeper device(s). For example, keeper inverter inv11 (of FIG. 7) is replaced with NOR gate 802 which controls the gate terminals of keeper device(s) MNK. In some embodiments, NOR gate 802 comprises n-type transistors $MN_{nn1}$ and $MN_{nn2}$, and p-type transistors $MP_{p3}$ and $MP_{p2}$ coupled together as shown. In some embodiments, the gate terminal of $MN_{nn1}$ is coupled to the LBL. In some embodiments, the gate terminal of $MP_{p3}$ is controlled by PCH#. In some embodiments, the gate terminal of $MP_{p2}$ is controlled by LBL. In some embodiments, the gate terminal of $MN_{nn1}$ is controlled by PCH#.

In some embodiments, to improve the read path delay further, the LBL is connected to the gate of transistor $MN_{nn1}$ of input NOR gate 802. In some embodiments, as LBL charges faster than the LBL node, it turns on transistor $MN_{nn1}$ faster which in turn disables keeper transistor MNK. Earlier turning-off of keeper stack mitigates the keeper contention and improves the read path delay.

In some embodiments, during the pre-discharge phase, keeper MNK is turned-OFF lowering the voltage stress across the gate oxide of the n-type transistor(s) MNK. This results in reduced keeper aging and improves the noise immunity. In some embodiments, when the other input of NOR 802 (e.g., input to gate of transistor $MN_{nn1}$ and $MP_{P2}$) is connected to the LBL node, it results in faster turn-off of keeper MNK and also degrades the noise tolerance as the input to the split NOR gate 802 is biased closer to the switching point.

In some embodiments, during read-0 scenario (e.g., reading a logic low), the voltage on the LBL node charges to Vcc. In some embodiments, during a transient noise event in a read-1 scenario (e.g., reading a logic high), the effect of noise is predominant on the LBL node. In some embodiments, transistor $MP_{p2}$ of split NOR gate 802 and the transistor $MN_{nn1}$ are connected to the LBL node.

In some embodiments, the inverter and associated transistor $MP_5$ of FIG. 7 is replaced by input NOR gate 804. In some embodiments, NOR gate 804 comprises n-type transistors $MN_{nn3}$ and $MN_{nn4}$, and p-type transistors $MP_{p3}$ and $MP_{p2}$ coupled together as shown. In some embodiments, the gate terminal of $MN_{nn2}$ is coupled to the GBL. In some embodiments, the gate terminal of $MP_{p5}$ is controlled by GBL PCH#. In some embodiments, the gate terminal of $MP_{p4}$ is controlled by GBL. In some embodiments, the gate terminal of $MN_{nn4}$ is controlled by PCH#.

In some embodiments, during read-0 scenario (e.g., reading a logic low), the voltage on the GBL node charges to Vcc. In some embodiments, during a transient noise event in a read-1 scenario (e.g., reading a logic 1), the effect of noise is predominant on the GBL node. In some embodiments, transistor $MP_{p4}$ of NOR gate 804 and transistor $MN_{nn3}$ are connected to the GBL node. The technical effect of NOR 802 and NOR 804 is similar to the technical effect of NAND 402 and NAND 504, respectively, in reducing the aging effects, in accordance with some embodiments.

Figure 9:
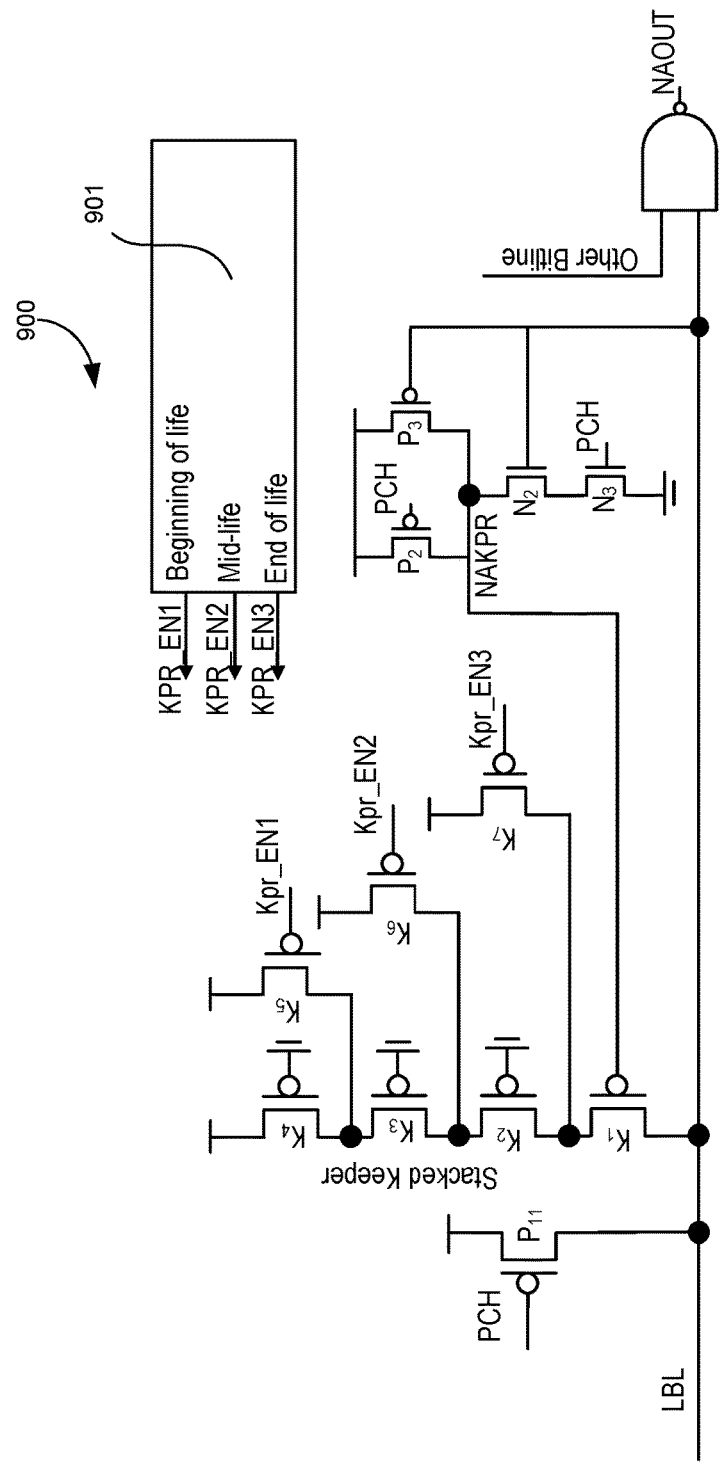
FIG. 9 illustrates a lifetime monitor dependent upsized keeper topology, according to some embodiments of the disclosure.

FIG. 9 illustrates apparatus 900 with a lifetime monitor dependent upsized keeper topology, according to some embodiments of the disclosure. It is pointed out that those elements of FIG. 9 having the same reference numbers (or names) as the elements of any other figure can operate or function in any manner similar to that described, but are not limited to such.

Apparatus 900 shows aging/lifetime monitor 901 based adaptive keeper topology to maintain the noise immunity over the operational lifetime, according to some embodiments of the disclosure. In some embodiments, aging/lifetime monitor 901 avoids the performance impact at the beginning of life due to upfront upsizing of the keeper stack. In some embodiments, bypass keeper devices ($K_5$, $K_6$, and, $K_7$) are provided for associated keeper devices of Stacked Keeper 302. In some embodiments, bypass keeper devices ($K_5$, $K_6$, and, $K_7$) are progressively activated by enable signals Kpr_EN1, Kpr_EN2, and Kpr_EN3, respectively, based on the design lifetime. Various schemes can be used for determining when to activate the enable signals Kpr_EN1, Kpr_EN2, and Kpr_EN3. For example, aging/lifetime monitor 901 includes circuitry that includes early aging indicating circuits that stress sample circuits (e.g., memory cells) and check if they lose data due to the added stress. By analyzing the outputs of the early aging indicating circuits, aging/lifetime monitor 901 sets when to enable signals Kpr_EN1, Kpr_EN2, and Kpr_EN3.

In some embodiments, Kpr_EN1 is set to logic low at the beginning of life (e.g., after 1 year of the usage of the product). In some embodiments, Kpr_EN2 is set to logic low at midlife (e.g., after 5 years of the usage of the product). In some embodiments, Kpr_EN3 is set to logic low at end of life (e.g., after 10 years of the usage of the product). The progressively activating of the keeper devices improves the effective keeper strength and maintain the same noise immunity over the lifetime. In some embodiments, a similar scheme can be adapted for the NOR based scheme of FIG. 8.

Figure 10:
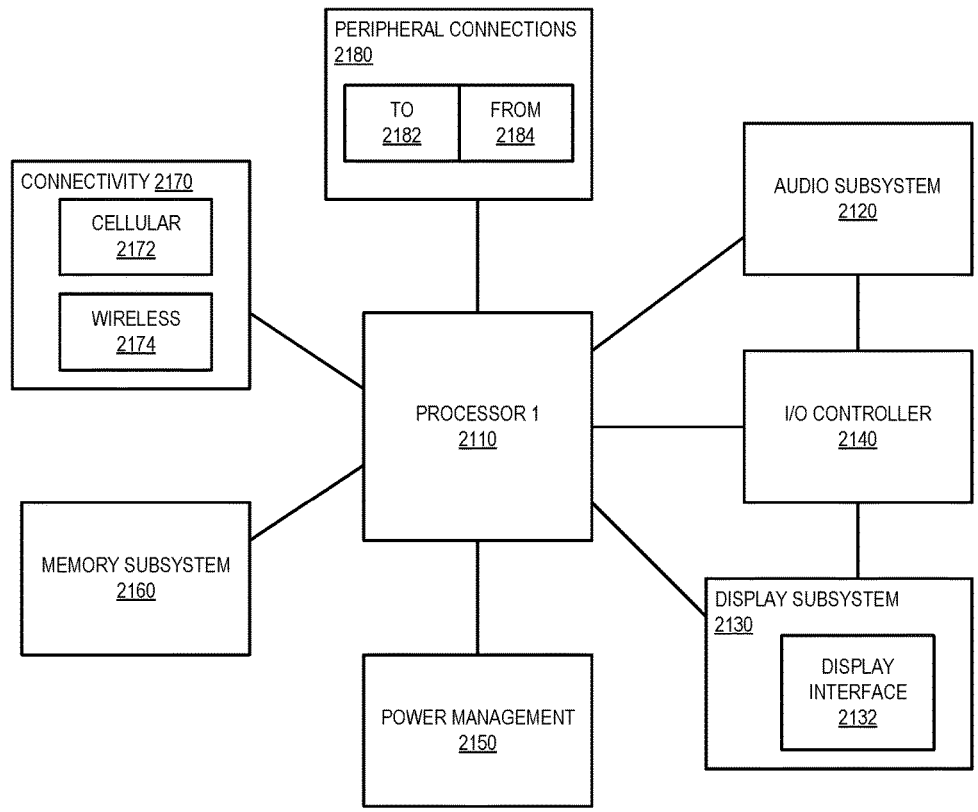
FIG. 10 illustrates a smart device or a computer system or a SoC (System-on-Chip) aging aware dynamic keeper, in accordance with some embodiments.

FIG. 10 illustrates a smart device or a computer system or a SoC (System-on-Chip) aging aware dynamic keeper, in accordance with some embodiments. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having an aging aware dynamic keeper, according to some embodiments discussed. Other blocks of the computing device 2100 may also include aging aware dynamic keeper according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus which comprises: a first transistor, of a first conductivity type, to turn on during a pre-charge mode; a stack of transistors of the first conductivity type, wherein the stack of transistors is coupled in parallel to the first transistor; and circuitry controllable by the pre-charge mode and a charge condition of a node coupled to the stack of transistors and the first transistor, wherein an output of the circuitry is to control at least one transistor of the stack.

Example 2 includes all features of example 1, wherein the node is one of a local bit-line (LBL) or a global bit-line (GBL).

Example 3 includes all features of example 1, wherein the stack of transistors comprises transistors having gate terminals biased to turn them on.

Example 4 includes all features of example 1, wherein the at least one transistor is to control the conduction through the stack of transistors.

Example 5 includes all features of example 1, wherein the apparatus of example 1 comprises a monitor circuitry to control strength of the stack of transistors overtime.

Example 6 includes all features of example 1, wherein the circuitry includes transistors of the first conductivity type and transistors of a second conductivity type.

Example 7 includes all features of example 1, wherein the circuitry comprises one of a NAND gate or a NOR gate.

Example 8 is an apparatus which comprises: a bit-line (BL) read port; a first local bit-line (LBL) coupled to the BL read port; a first NAND gate coupled to the first LBL and a second LBL, wherein the first NAND gate is to provide an output which is coupled to a gate of a transistor; a first transistor, of a first conductivity type, to turn on during a first pre-charge mode, the first transistor coupled to the first LBL; a first stack of transistors of the first conductivity type, wherein the first stack of transistors is coupled in parallel to the first transistor; and a second NAND gate coupled to the first NAND gate, wherein the second NAND gate is controllable by the first pre-charge mode and a charge condition of the first LBL coupled to the first stack of transistors and the first transistor, wherein an output of the second NAND gate is to control at least one transistor of the first stack.

Example 9 includes all features of example 8, wherein the apparatus of example 8 comprises a global BL (GBL) coupled to the transistor.

Example 10 includes all features of example 9, wherein the GBL is coupled to a set dominant latch (SDL).

Example 11 includes all features of example 9, wherein the apparatus of example 8 comprises: a second transistor, of the first conductivity type, to turn on during a second pre-charge mode, the second transistor coupled to the GBL; a second stack of transistors of the first conductivity type, wherein the second stack of transistors is coupled in parallel to the second transistor; and a third NAND gate coupled to GBL, wherein the third NAND gate is controllable by the second pre-charge mode and a charge condition of the GBL coupled to the second stack of transistors and the second transistor, wherein an output of the third NAND gate is to control at least one transistor of the second stack.

Example 12 includes all features of example 11, wherein the apparatus of example 12 comprises a monitor circuitry to control strength of the first and second stack of transistors overtime.

Example 13 is an apparatus which comprises: a memory bit-cell; a local bit-line (LBL) coupled to the memory bit-cell via a read port device; a NAND gate circuitry coupled to the LBL; and a stack of keepers coupled to the LBL, wherein at least one transistor of the stack of keepers is controllable according to an output of the NAND gate circuitry, wherein the stack of keepers includes transistors with variable strength which are to be turned on overtime.

Example 14 includes all features of example 13, wherein the memory bit-cell comprises an SRAM bit-cell.

Example 15 includes all features of example 13, wherein the LBL is coupled to another NAND gate circuitry which is couple to another LBL.

Example 16 includes all features of example 13, wherein the transistors with variable strength are controllable by an aging monitor circuitry.

Example 17 is a system which comprises: a memory; a processor coupled to the memory, the processor including a register file (RF) which comprises an apparatus according to any one of examples 13 to 16; and a wireless interface to allow the processor to communicate with another device.

Example 18 is a system which comprises: a memory; a processor coupled to the memory, the processor including a register file (RF) which comprises an apparatus according to any one of examples 1 to 7; and a wireless interface to allow the processor to communicate with another device.

Example 19 is a system which comprises: a memory; a processor coupled to the memory, the processor including a register file (RF) which comprises an apparatus according to any one of examples 8 to 10; and a wireless interface to allow the processor to communicate with another device.

Example 20 is a method which comprises: forming a first transistor, of a first conductivity type, to turn on during a pre-charge mode; forming a stack of transistors of the first conductivity type, wherein the stack of transistors is coupled in parallel to the first transistor; and forming circuitry controllable by the pre-charge mode and a charge condition of a node coupled to the stack of transistors and the first transistor, wherein an output of the circuitry is to control at least one transistor of the stack.

Example 21 includes all features of example 20, wherein the node is one of a local bit-line (LBL) or a global bit-line (GBL).

Example 22 includes all features of example 20, wherein the stack of transistors comprises transistors having gate terminals biased to turn them on.

Example 23 includes all features of example 20, wherein the at least one transistor is to control the conduction through the stack of transistors.

Example 24 includes all features of example 20, wherein the method of claim 24 comprises forming a monitor circuitry to control strength of the stack of transistors overtime.

Example 25 includes all features of example 20, wherein the circuitry includes transistors of the first conductivity type and transistors of a second conductivity type.

Example 26 includes all features of example 20, wherein the circuitry comprises one of a NAND gate or a NOR gate.

Example 27 is a method which comprises: forming a bit-line (BL) read port; forming a first local bit-line (LBL) coupled to the BL read port; forming a first NAND gate coupled to the first LBL and a second LBL, wherein the first NAND gate is to provide an output which is coupled to a gate of a transistor; forming a first transistor, of a first conductivity type, to turn on during a first pre-charge mode, the first transistor coupled to the first LBL; forming a first stack of transistors of the first conductivity type, wherein the first stack of transistors is coupled in parallel to the first transistor; and forming a second NAND gate coupled to the first NAND gate, wherein the second NAND gate is controllable by the first pre-charge mode and a charge condition of the first LBL coupled to the first stack of transistors and the first transistor, wherein an output of the second NAND gate is to control at least one transistor of the first stack.

Example 28 includes all features of example 27, wherein the method of example 28 comprises forming a global BL (GBL) coupled to the transistor.

Example 29 includes all features of example 28, wherein the GBL is coupled to a set dominant latch (SDL).

Example 30 includes all features of example 29, wherein the method of example 30 comprises: forming a second transistor, of the first conductivity type, to turn on during a second pre-charge mode, the second transistor coupled to the GBL; forming a second stack of transistors of the first conductivity type, wherein the second stack of transistors is coupled in parallel to the second transistor; and forming a third NAND gate coupled to GBL, wherein the third NAND gate is controllable by the second pre-charge mode and a charge condition of the GBL coupled to the second stack of transistors and the second transistor, wherein an output of the third NAND gate is to control at least one transistor of the second stack.

Example 31 includes all features of example 30, wherein the method of example 30 comprises forming a monitor circuitry to control strength of the first and second stack of transistors overtime.

Example 32 is a method which comprises: forming a memory bit-cell; forming a local bit-line (LBL) coupled to the memory bit-cell via a read port device; forming a NAND gate circuitry coupled to the LBL; and forming a stack of keepers coupled to the LBL, wherein at least one transistor of the stack of keepers is controllable according to an output of the NAND gate circuitry, wherein the stack of keepers includes transistors with variable strength which are to be turned on overtime.

Example 33 includes all features of example 32, wherein the memory bit-cell comprises an SRAM bit-cell.

Example 34 includes all features of example 32, wherein the LBL is coupled to another NAND gate circuitry which is couple to another LBL.

Example 35 includes all features of example 32, wherein the transistors with variable strength are controllable by an aging monitor circuitry.

Example 36 is an apparatus which comprises: a first transistor, of a first conductivity type, to turn on during a pre-charge mode; a stack of transistors of the first conductivity type, wherein the stack of transistors is coupled in parallel to the first transistor; and means controllable by the pre-charge mode and a charge condition of a node coupled to the stack of transistors and the first transistor, wherein an output of the means is to control at least one transistor of the stack.

Example 37 includes all features of example 36, wherein the node is one of a local bit-line (LBL) or a global bit-line (GBL).

Example 38 includes all features of example 36, wherein the stack of transistors comprises transistors having gate terminals biased to turn them on.

Example 39 includes all features of example 36, wherein the at least one transistor is to control the conduction through the stack of transistors.

Example 40 includes all features of example 36, wherein the apparatus of example 40 comprises monitoring means to control strength of the stack of transistors overtime.

Example 41 includes all features of example 36, wherein the means include transistors of the first conductivity type and transistors of a second conductivity type.

Example 43 includes all features of example 36, wherein the means comprises one of a NAND gate or a NOR gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a transistor, of a conductivity type, to turn on during a pre-charge mode;
   a stack of transistors of the conductivity type, wherein the stack of transistors is coupled in parallel to the transistor; and
   a first circuitry controllable by the pre-charge mode and a charge condition of a node, wherein:
   the node is directly coupled to one transistor of the stack of transistors and the transistor without an intermediate pass-gate, and wherein an output of the circuitry is to control at least one transistor of the stack,
   the node is one of a local bit-line (LBL) or a global bit-line (GBL), and
   the LBL or GBL is directly coupled to a second circuitry that is to provide an electrical path to a ground node or a power supply rail for a read operation.

2. The apparatus of claim 1, wherein the stack of transistors comprises transistors having gate terminals biased to turn them on.

3. The apparatus of claim 1, wherein the at least one transistor is to control the conduction through the stack of transistors.

4. The apparatus of claim 1 comprises a monitor circuitry to control strength of the stack of transistors overtime.

5. The apparatus of claim 1, wherein the conductivity type is a first conductivity type, and wherein the circuitry includes transistors of the first conductivity type and transistors of a second conductivity type.

6. The apparatus of claim 1, wherein the first circuitry comprises one of a NAND gate or a NOR gate.

7. The apparatus of claim 1, wherein the one transistor of the stack is a first transistor, and wherein the stack of transistors comprises:
   the first transistor, wherein the first transistor is coupled to the output of the circuitry;
   a second transistor coupled in series with the first transistor and coupled to the output of the circuitry;
   a third transistor coupled in series with the second transistor; and
   a fourth transistor coupled is series with the third transistor, wherein the fourth transistor is coupled to a supply node.

8. The apparatus of claim 1, wherein the third and fourth transistor have corresponding gate terminals that are biased to turned on the third and fourth transistors.

9. The apparatus of claim 1, wherein the second circuitry comprises:
   a first transistor coupled to the node and controllable by a read word line; and
   a second transistor coupled to series with the first transistor, wherein the second transistor is controllable by data from a memory bit-cell.

10. An apparatus comprising:
    a bit-line (BL) read port;
    a first local bit-line (LBL) coupled to the BL read port;
    a first NAND gate coupled to the first LBL and a second LBL, wherein the first NAND gate is to provide an output which is coupled to a gate of a transistor;

a first transistor, of a first conductivity type, to turn on during a first pre-charge mode, the first transistor coupled to the first LBL;

a first stack of transistors of the first conductivity type, wherein the first stack of transistors is coupled in parallel to the first transistor; and a second NAND gate coupled to the first NAND gate, wherein the second NAND gate is controllable by the first pre-charge mode, wherein at least two transistors of the second NAND gate are controllable by a charge condition of the first LBL directly coupled to the first stack of transistors and the first transistor, and wherein an output of the second NAND gate is to control at least one transistor of the first stack.

11. The apparatus of claim 10 comprises a global BL (GBL) coupled to the transistor.

12. The apparatus of claim 11, wherein the GBL is coupled to a set dominant latch (SDL).

13. The apparatus of claim 11 comprises:

a second transistor, of the first conductivity type, to turn on during a second pre-charge mode, the second transistor coupled to the GBL;

a second stack of transistors of the first conductivity type, wherein the second stack of transistors is coupled in parallel to the second transistor; and a third NAND gate coupled to GBL, wherein the third NAND gate is controllable by the second pre-charge mode and a charge condition of the GBL coupled to the second stack of transistors and the second transistor, wherein an output of the third NAND gate is to control at least one transistor of the second stack.

14. The apparatus of claim 13 comprises a monitor circuitry to control strength of the first and second stack of transistors overtime.

15. An apparatus comprising:

a memory bit-cell;

a local bit-line (LBL) coupled to the memory bit-cell via a read port device;

a NAND gate circuitry, wherein at least two transistors of the NAND gate circuitry are directly coupled to the LBL; and a stack of keepers coupled to the LBL, wherein at least one transistor of the stack of keepers is controllable according to an output of the NAND gate circuitry, and wherein the stack of keepers includes transistors with variable strength which are to be turned on overtime.

16. The apparatus of claim 15, wherein the memory bit-cell comprises an SRAM bit-cell.

17. The apparatus of claim 15, wherein the LBL is coupled to another NAND gate circuitry which is couple to another LBL.

18. The apparatus of claim 15, wherein the transistors with variable strength are controllable by an aging monitor circuitry.

19. A system comprising:

a memory;

a processor coupled to the memory, the processor including a register file (RF) which comprises:

a memory bit-cell;

a local bit-line (LBL) coupled to the memory bit-cell via a read port device;

a NAND gate circuitry, wherein at least two transistors of the NAND gate circuitry are directly coupled to the LBL; and a stack of keepers coupled to the LBL, wherein at least one transistor of the stack of keepers is controllable according to an output of the NAND gate circuitry, wherein the stack of keepers includes transistors with variable strength which are to be turned on overtime; and a wireless interface to allow the processor to communicate with another device.

20. The system of claim 19, wherein the memory bit-cell comprises an SRAM bit-cell.

21. The system of claim 19, wherein the LBL is coupled to another NAND gate circuitry which is coupled to another LBL.

22. The system of claim 19, wherein the transistors with variable strength are controllable by an aging monitor logic.

* * * * *